(12) United States Patent
Yi et al.

(10) Patent No.: US 11,195,917 B2
(45) Date of Patent: Dec. 7, 2021

(54) SEMICONDUCTOR DEVICE

(71) Applicant: SAMSUNG ELECTRONICS CO., LTD., Suwon-si (KR)

(72) Inventors: Jihye Yi, Suwon-si (KR); Unki Kim, Suwon-si (KR); Dongchan Suh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/743,627

(22) Filed: Jan. 15, 2020

(65) Prior Publication Data
US 2020/0373391 A1 Nov. 26, 2020

(30) Foreign Application Priority Data
May 24, 2019 (KR) .......................... 10-2019-0061196

(51) Int. Cl.
*H01L 29/10* (2006.01)
*H01L 29/423* (2006.01)
*H01L 29/78* (2006.01)

(52) U.S. Cl.
CPC .... *H01L 29/1037* (2013.01); *H01L 29/42392* (2013.01); *H01L 29/785* (2013.01)

(58) Field of Classification Search
CPC ....................... H01L 26/42392; H01L 26/0673
See application file for complete search history.

(56) References Cited

U.S. PATENT DOCUMENTS

| | | | |
|---|---|---|---|
| 7,112,832 B2 | 9/2006 | Orlowski et al. | |
| 7,381,601 B2 | 6/2008 | Kim et al. | |
| 8,293,608 B2 | 10/2012 | Orlowski et al. | |
| 9,590,089 B2 | 3/2017 | Rachmady et al. | |
| 9,691,851 B1 | 6/2017 | Fung | |
| 9,871,140 B1 | 1/2018 | Balakrishnan et al. | |
| 9,972,701 B2 | 5/2018 | Kim et al. | |
| 9,972,720 B2 | 5/2018 | Bae | |
| 9,984,936 B1 | 5/2018 | Xie et al. | |
| 10,043,748 B1 | 8/2018 | Chao et al. | |
| 10,103,238 B1 | 10/2018 | Zang et al. | |
| 10,204,983 B2 | 2/2019 | Suk et al. | |
| 2017/0110554 A1 | 4/2017 | Tak et al. | |
| 2018/0261670 A1 | 9/2018 | Yeung et al. | |
| 2018/0301531 A1 | 10/2018 | Xie | |
| 2020/0365687 A1* | 11/2020 | Xie et al. | ............ H01L 29/0673 |

* cited by examiner

*Primary Examiner* — Yu-Hsi D Sun
(74) *Attorney, Agent, or Firm* — F. Chau & Associates, LLC

(57) ABSTRACT

A semiconductor device is described that includes a substrate, an active region protruding from the substrate and extending in a first direction, a plurality of channel layers disposed on the active region and spaced apart from each other in a direction perpendicular to an upper surface of the substrate, an isolation film disposed between a lowermost channel layer of the plurality of channel layers and the active region, a gate electrode surrounding the plurality of channel layers and extending in a second direction intersecting the first direction, and a source/drain region disposed on at least one side of the gate electrode and connected to each of the plurality of channel layers. The isolation film is disposed on a level higher than a bottom surface of the source/drain region.

14 Claims, 9 Drawing Sheets

SEMICONDUCTOR DEVICE

CROSS-REFERENCE TO RELATED APPLICATION(S)

This application claims benefit of priority to Korean Patent Application No. 10-2019-0061196 filed on May 24, 2019 in the Korean Intellectual Property Office, the disclosure of which is incorporated herein by reference in its entirety.

BACKGROUND

Mobile electronic devices such as tablet computers and mobile phones are used by many people. Semiconductor devices are commonly used in mobile electronic devices. As demand for mobile electronic devices increases, semiconductor manufacturing processes must keep pace.

Progressively smaller designs of semiconductor devices provide for packaging benefits. However, smaller designs may also create performance constraints, for example, by reducing the size of the semiconductor. Thus, improvements to semiconductor design preferably enable a reduction in size while resulting in minimal performance loss, no performance loss, or performance improvements.

In some cases, performance problems of a semiconductor device can be attributed to electrical current leakage. Furthermore, optimal performance often requires a consistent electrical power supply. Therefore, there is a need in the art to improve the performance of a semiconductor device by reducing electrical current leakage.

SUMMARY

The present disclosure describes semiconductor devices capable of reducing leakage of current through a substrate between adjacent transistors. For example, aspects of the inventive concept include a three-dimensional channel which with improved electrical properties.

According to an example embodiment, a semiconductor device is described that includes a substrate, an active region protruding from the substrate in a first direction, channel layers disposed on the active region and spaced apart from each other in a direction perpendicular to an upper surface of the substrate, an isolation film disposed between a lowermost channel layer of the plurality of channel layers and the active region, a gate electrode surrounding the plurality of channel layers and extending in a second direction intersecting the first direction, and a source/drain region disposed on at least one side of the gate electrode and connected to each of the plurality of channel layers. In some cases, the isolation film is disposed on a level higher than a bottom surface of the source/drain region.

According to an example embodiment of the present inventive concept, a semiconductor device is provided, the semiconductor device including a substrate, an active region protruding from the substrate and extending in a first direction, a plurality of channel layers disposed on the active region and spaced apart from each other in a direction perpendicular to an upper surface of the substrate, an isolation film disposed between a lowermost channel layer of the plurality of channel layers and the active region, a gate electrode surrounding the plurality of channel layers and extending in a second direction intersecting the first direction, internal spacers disposed between the plurality of channel layers and disposed on both sides of the gate electrode in the first direction, and a plurality of source/drain regions disposed on both sides of the gate electrode in the first direction and connected to the plurality of channel layers, wherein the internal spacers and regions adjacent to both sides of the isolation film in the first direction include a same material, and the isolation film is disposed on a level higher than a bottom surface of the source/drain region.

According to an example embodiment of the present inventive concept, a semiconductor device is provided, the semiconductor device including a substrate, an active region protruding from the substrate and extending in a first direction, a plurality of channel layers disposed on the active region and spaced apart from each other in a direction perpendicular to an upper surface of the substrate, a gate electrode surrounding the plurality of channel layers and extending in a second direction intersecting the first direction, internal spacers disposed between the plurality of channel layers and disposed on both sides of the gate electrode in the first direction, an isolation film disposed between a lowermost channel layer of the plurality of channel layers and the active region, wherein the isolation film and the internal spacers have a same material, and a source/drain regions disposed on each of both sides of the gate electrode in the first direction, having a bottom surface disposed on a level lower than the isolation film, and connected to each of the plurality of channel layers.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Semiconductor devices may be scaled down to reduce overall size and packaging. Optimization the structure of a transistor can produce improved performance. For example, an optimized structure may provide high speed and accuracy. According to example embodiments of the present disclosure, transistors may include a three-dimensional channel in which an active fin is formed on a substrate. A gate may be formed using the active fin.

In an example embodiment, a channel structure of a Multi-Bridge Channel Field Effect Transistor (MBCFET) is formed with a Si/SiGe multi-nanosheet structure. In an MBCFET, a SiGe layer (including Ge in a content higher than a content of Ge included a first semiconductor pattern) may be added in a lower portion of a lowermost channel layer as a semiconductor pattern for isolation (i.e., a sacrificial layer).

When an internal spacer is formed, the semiconductor pattern for isolation may be etched further than the first semiconductor pattern, and a self-aligned internal spacer having a thickness greater than a thickness of the internal spacer may be formed in the space from which the semiconductor pattern for isolation is removed. Accordingly, electrical isolation from a substrate may be enhanced. The structure and material of an isolation film used in the example embodiment may be varied.

In some example embodiments, an internal spacer and a surrounding region of the isolation film may be formed of the same material. In some cases, the material of the semiconductor pattern for isolation is completely removed. In other example embodiments, the internal spacer may be omitted or may be partially formed. Furthermore, an epitaxial process for a source/drain region may be performed while the substrate is exposed, so that degradation of performance caused by strain loss may be prevented.

Hereinafter, embodiments of the present inventive concept will be described as follows with reference to the accompanying drawings.

Figure 1:
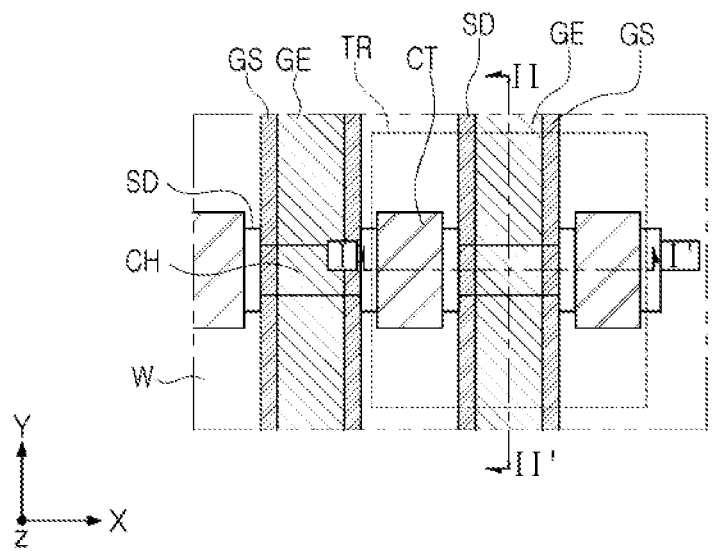
FIG. 1 is a plan diagram illustrating a semiconductor device according to an example embodiment of the present inventive concept.
Figure 2:
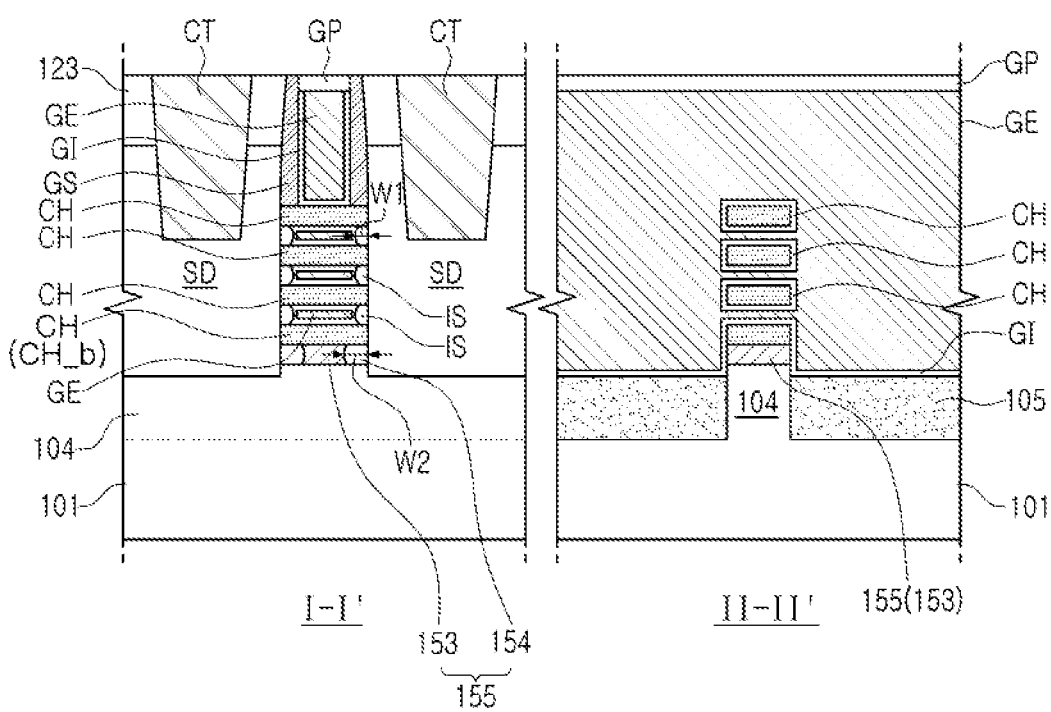
FIG. 2 is cross-sectional diagrams taken along lines I-I' and II-IF in FIG. 1.

FIG. 1 is a plan diagram illustrating a semiconductor device according to an example embodiment. FIG. 2 is cross-sectional diagrams taken along lines I-I' and II-IF in FIG. 1.

Referring to FIGS. 1 and 2, a semiconductor device 100 in an example embodiment may include a substrate 101 and a transistor TR disposed on the substrate 101. As illustrated in FIG. 1, a well W of the substrate 101 may be implemented as an n-type well or a p-type well. When the well W is an n-type well, the transistor TR may be implemented as a P-MOSFET. When the well W is a p-type well, the transistor TR may be implemented as an N-MOSFET.

The transistors TR may include an active region 104 extending in a first direction (e.g., X direction) on the substrate 101. The active region 104 may have a protruding fin structure extending in the first direction. For example, the substrate 101 may be implemented as a semiconductor substrate such as a silicon substrate or a germanium substrate, or a silicon-on-insulator substrate (SOI).

A device isolation layer 105 may define an active region 104 and may be formed of an oxide film, a nitride film, or a combination thereof, for example. The device isolation layer 105 may be disposed on the substrate 101 and may cover side surfaces of the active region 104 of the substrate 101. An upper surface of the device isolation layer 105 may be disposed on a level lower than an upper surface of the active region 104.

As illustrated in FIG. 2, the transistor TR may include a plurality of channel layers CH disposed on the active region 104 and spaced apart from each other in a direction (e.g., Z direction) perpendicular to an upper surface of the substrate 101. Additionally, the transistor TR may include a gate electrode GE surrounding the plurality of channel layers CH and extending in a second direction (e.g., Y direction) intersecting the first direction (e.g., X direction). For example, the gate electrode GE may surround the plurality of channel layers CH on at least three sides in a plane extending in the second direction and perpendicular to an upper surface of the substrate 101.

The transistor TR may include a source/drain region SD disposed in the active region 104 disposed on at least one side of the gate electrode GE and connected to the plurality of channel layers CH. In an example embodiment, the source/drain region SD may be disposed on the active region 104 disposed on each of both sides of the gate electrode GE. The source/drain region SD may be connected to both sides of each of the plurality of channel layers CH in the first direction (e.g., an X-direction). In an example embodiment, three-channel layers CH may be provided, but the number of the channel layers CH is not limited thereto. The channel layers CH may include semiconductor patterns. For example, the semiconductor patterns may include at least one of silicon (Si), silicon-germanium (SiGe), or germanium (Ge).

The source/drain region SD may include an epitaxial layer formed using the plurality of channel layers CH and the active region 104 as seeds. The source/drain region SD may include at least one of silicon-germanium (SiGe), silicon (Si), or silicon carbide (SiC). In some example embodiments, the source/drain region SD may be configured to provide tensile strain to the channel layers CH. As an example, when the semiconductor patterns 104 include silicon (Si), the source/drain region SD may include silicon (Si) or silicon carbide (SiC). In other example embodiments, the source/drain region SD may be configured to provide compressive strain to the channel layers CH. As an example, when the channel layers CH include silicon (Si), the source/drain region SD may include silicon-germanium (SiGe). The source/drain region SD may further include a dopant. The dopant may be employed to improve electrical properties of the transistor including the source/drain region SD. When the transistor TR is an N-MOSFET, the dopant may be phosphorus (P), for example. When the transistor TR is a P-MOSFET, the dopant may be boron (B).

The gate structure employed in an example embodiment may include a gate electrode GE, a gate insulating layer GI, gate spacers GS, a gate capping pattern GP. The gate insulating layer GI is disposed between the gate electrode GE and the channel layers CH. The gate spacers GS are disposed on side surfaces of the gate electrode GE. The gate capping pattern GP is disposed on an upper surface of the gate electrode GE.

The gate insulating layer GI may extend to a space between the gate electrode GE and the gate spacers GS, and an uppermost surface of the gate insulating layer GI may be substantially coplanar with the upper surface of the gate electrode GE. The gate electrode GE may cover an uppermost surface of the channel layer CH and may cover both side surfaces of the channel layers CH in the second direction (see the diagram on the right side in FIG. 2). The gate electrode GE may extend in the second direction and may cover upper surfaces of the device isolation layer 105.

The gate electrode GE may be disposed in a space between the channel layers CH (see the diagram on the left side in FIG. 2). The gate insulating layer GI may be interposed between each of the channel layers CH and the gate electrode GE and may surround an external surface of each of the channel layers CH. Each of the channel layers CH may be isolated from the gate electrode GE with the gate insulating layer GI interposed therebetween. The gate insulating layer GI may extend along a bottom surface of the gate electrode GE and may be interposed between the gate electrode GE and the active region 104 and between the gate electrode GE and the device isolation layer 105.

As described above, the gate electrode GE, the channel layer CH, and the source/drain region SD may be included in a gate-all-around type field effect transistor.

The gate electrode GE may include a doped semiconductor, a conductive metal nitride, or a metal. For example, the gate electrode GE may include a metal nitride such as TiN, WN, and TaN or a metal such as Ti, W, and Ta. The gate insulating layer GI may include at least one of a silicon oxide film, a silicon nitride film, a silicon oxynitride film, or a high dielectric film. The high dielectric film may include a material having a dielectric constant higher than a dielectric constant of a silicon oxide film. Examples of materials with a dielectric constant higher than a dielectric constant of a silicon oxide may be a hafnium oxide film (HfO), an aluminum oxide film (AlO), or a tantalum oxide film (TaO). Each of the gate spacer GS and the gate capping pattern GP may include at least one of a silicon oxide film, a silicon nitride film, or a silicon oxynitride film.

As illustrated in FIG. 2, in an example embodiment, internal spacers IS may be disposed on both sides of the gate electrode GE in the first direction between the plurality of channel layers CH. Accordingly, the internal spacers IS may be provided between each of the source/drain regions SD and the gate electrode GE.

The internal spacers IS may be provided on one side of the gate electrode GE, and may be spaced apart from each other in a direction (e.g., a Z-direction) perpendicular to the upper surface of the substrate 101. The internal spacers IS and the channel layers CH may be alternately and repeatedly layered in the direction perpendicular to the upper surface of the substrate 101. The internal spacer IS may be provided in a space between adjacent channel layers CH. The source/drain regions SD may be in contact with the channel layers CH, respectively, and may be spaced apart from the gate electrode GE with the internal spacer IS interposed therebetween. As the gate insulating layer GI is interposed between the gate electrode GE and each of the channel layers CH, the gate insulating layer GI may be configured to extend to a space between the gate electrode GE and each of the internal spacer IS. Each of the internal spacers IS may be in contact with the gate insulating layer GI between the channel layers CH.

Each of the internal spacers IS may have a width in the first direction. For example, a width of each of the internal spacers IS may be within a range of 1 Å to 10 nm. In some example embodiments, one surface of each of the internal spacers IS directly adjacent to the gate electrode GE may be configured to have a substantially planar surface or a substantially rounded surface.

In some example embodiments, the internal spacers IS may include at least one of SiN, SiCN, SiOCN, SiBCN, or SiBN. For example, the internal spacers IS may include a silicon nitride. In an example embodiment, the internal spacers IS may include a semiconductor in which a dopant is not doped, or a semiconductor including a dopant having a conductivity-type different from a conductivity-type of a dopant of the source/drain.

The transistor TR in an example embodiment may include an isolation film 155 disposed between a lowermost channel layer CH_b of the plurality of channel layers CH and the active region 104. The isolation film 155 may be used as a structure for preventing leakage of current through a subregion between adjacent transistors. In an example embodiment, the isolation film 155 may be disposed on a level higher than a bottom surface of the source/drain region SD as illustrated in FIG. 2. For example, the isolation film 155 may be located above the active region 104 at a level higher than the bottom surface of the source/drain region in a direction perpendicular to an upper surface of the substrate 101 (i.e., the Z direction).

The isolation film 155 may include insulator regions 154 where the included insulator regions 154 may be disposed on both sides of the isolation film 155 in the first direction, respectively. A semiconductor region 153 may be disposed between the insulator regions 154.

A width W2 of each of the insulator regions 154, in the first direction, may be configured to be greater than a width W1 of each of the internal spacers IS in the first direction. The insulator regions 154 may include a similar material to the material of the internal spacers IS. The insulator regions 154 may be formed together with the internal spacers IS in a process for forming the internal spacers IS.

The semiconductor region 153 of the isolation film 155 may include a semiconductor material different from a semiconductor material of the plurality of channel layers CH. For example, when the semiconductor material of the plurality of channel layers CH is Si, the semiconductor region 153 of the isolation film 155 may include SiGe. The semiconductor region 153 may include a relatively high content of Ge. For example, the semiconductor region 153 may include a content of about 35% or higher of Ge, and may include a content of about 50% or higher of SiGe.

An interlayer insulating film 123 may be provided on the substrate 101, and may cover the gate structure and the source/drain region SD. The interlayer insulating film 123 may include at least one of a silicon oxide film, a silicon nitride film, a silicon oxynitride film, or a low dielectric film. An upper surface of the gate capping pattern GP may be substantially coplanar with an upper surface of the interlayer insulating film 123. The gate spacers GS may be interposed between the gate capping pattern GP and the interlayer insulating film 123.

Contact plugs CT penetrating the interlayer insulating film 123, and connected to the source/drain regions SD, respectively, may be provided. The contact plugs CT may be in contact with the source/drain region SD. The contact plugs CT may include a conductive metal nitride or a metal. For example, the contact plugs CT may include a metal nitride such as TiN, WN, and TaN or a metal such as Ti, W, and Ta.

FIGS. 3A to 3F are perspective diagrams illustrating portions of processes of a method for manufacturing a semiconductor device according to an example embodiment.

Figure 3A:
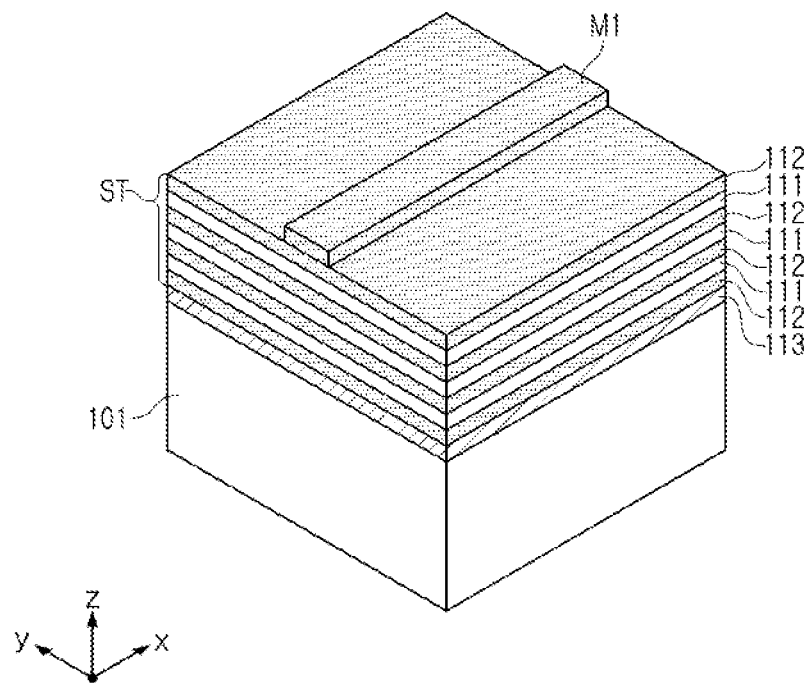
FIGS. 3A to 3F are perspective diagrams illustrating portions of processes of a method for manufacturing a semiconductor device according to an example embodiment of the present inventive concept.

Referring to FIG. 3A, a semiconductor layer for isolation 113 may be formed on a substrate 101, and a stack structure ST in which first semiconductor layers 111 and second semiconductor layers 112 are alternately layered may be formed.

The semiconductor layer for isolation 113 may be disposed in a lowermost portion of the stack structure ST. The second semiconductor layer 112 may be disposed on the semiconductor layer for isolation 113. An uppermost layer of the stack structure ST may be configured to be the second semiconductor layer 112, but an example embodiment thereof is not limited thereto. The first semiconductor layers 111 and the second semiconductor layers 112 may be formed using an epitaxial growth method, but the method is not limited thereto. The semiconductor layer for isolation 113, the first semiconductor layers 111, and the second semiconductor layers 112 may include materials having different etch selectivities. In a subsequent process, while the first semiconductor layers 111 are etched, the second semiconductor layers 112 may not be etched and may remain unchanged. The first semiconductor layers 111 may be used as sacrificial layers for forming a gate electrode, and the second semiconductor layers 112 may remain and may be used as channel layers.

The semiconductor layer for isolation 113 employed in an example embodiment may be formed of a material having an etch rate higher than an etch rate of the first semiconductor layers 111. Under the condition in which the first semiconductor layers 111 may be selectively etched, an etch rate of the semiconductor layer for isolation 113 may be used rather than an etch rate of the first semiconductor layers 111. Selectivities of the semiconductor layer for isolation 113 and the first semiconductor layers 111 may be implemented based on a difference in content of Ge. For example, the first semiconductor layers 111 may include SiGe which comprises a first content of Ge, and the semiconductor layer for isolation 113 may include SiGe which consists of a second content of Ge, higher than the first content of Ge. The second content of Ge may be higher than the first content of Ge (e.g., by 10%, 35%, 50%, or higher). The second semiconductor layers 112 may include one of Si and a III-V group compound semiconductor.

A first mask pattern M1 extending in the first direction (e.g., X direction) may be formed on the stack structure ST. The first mask pattern M1 may be formed of at least one of a silicon oxide film, a silicon nitride film, or a silicon oxynitride film.

Figure 3B:
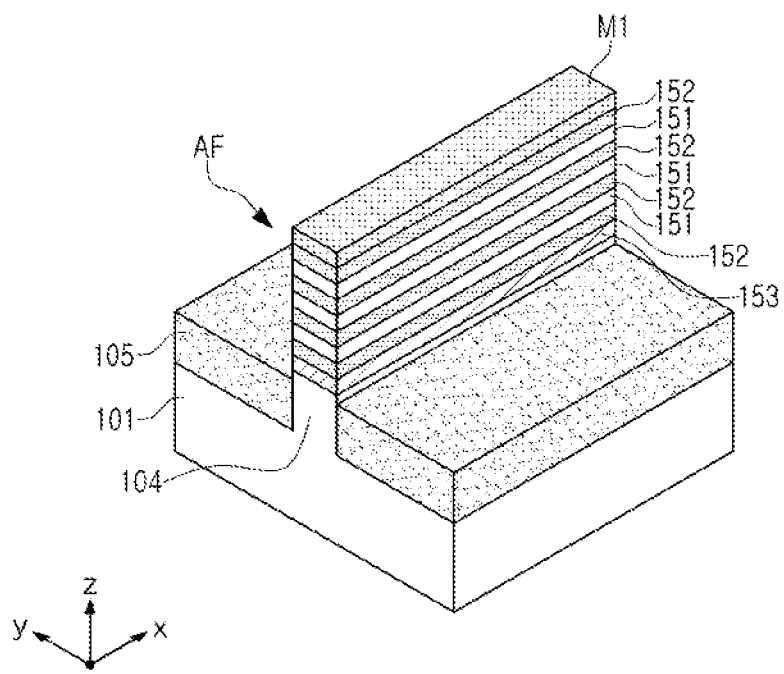

Referring to FIG. 3B, the stack structure ST may be etched using the first mask pattern M1, thereby forming a fin-type structure AF.

The fin-type structure AF may include a semiconductor pattern for isolation 153', and second semiconductor patterns 152 and first semiconductor patterns 151 alternately layered on the semiconductor pattern for isolation 153'. An active region 104 having a protruding portion, protruding along with the fin-type structure AF, may be formed by etching up to a partial region of an upper surface of the substrate 101, and a device isolation layer 105 may be formed around the protruding portion. An upper surface of the device isolation layer 105 may be disposed on a level lower than an upper surface of the protruding portion of the active region 104. The fin-type structure AF may be formed in the first direction.

Figure 3C:
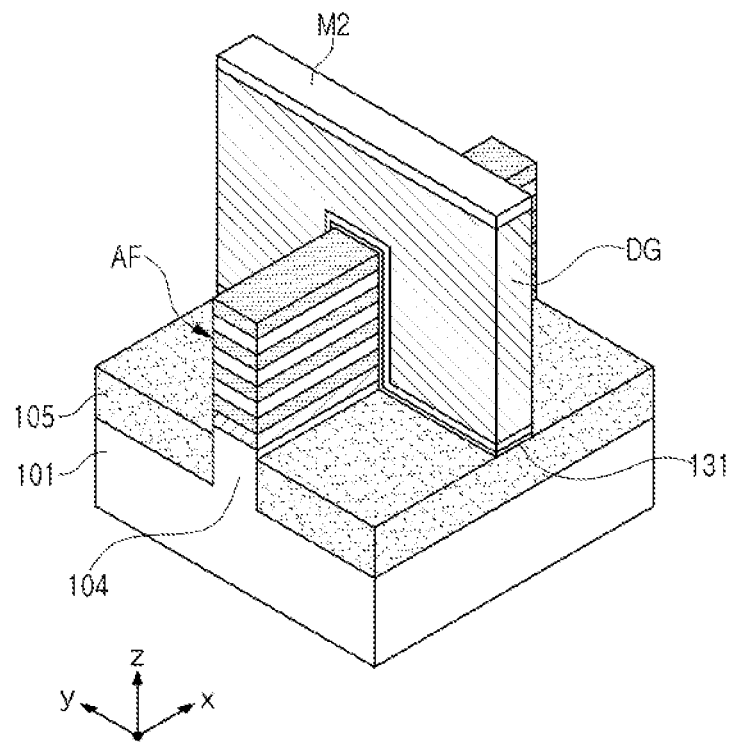

Referring to FIG. 3C, an etch stop layer and a dummy gate layer may be formed to cover the fin-type structure AF, and an etching process may be performed using a second mask pattern M2 formed in the second direction (e.g., Y direction), thereby forming an etch stop pattern 131 and a dummy gate pattern DG.

The dummy gate pattern DG may intersect a partial region of the fin-type structure AF and may extend in the second direction (e.g., Y direction). For example, the etch stop pattern 131 may be formed of a silicon oxide, a silicon nitride, or a combination thereof. For example, the dummy gate pattern DG may be one of a polysilicon and an amorphous silicon.

Figure 3D:
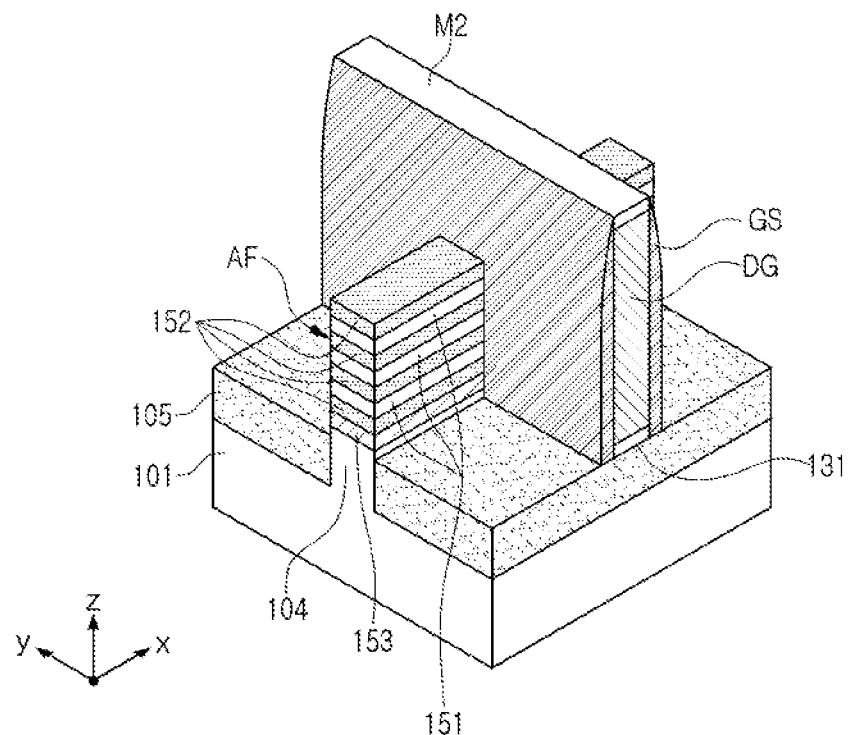

Referring to FIG. 3D, gate spacers GS may be formed on side walls of the dummy gate pattern DG.

For example, in this process, a spacer film covering the dummy gate pattern DG and the fin-type structure AF may be conformally formed, and the spacer film may be etched back, thereby forming the gate spacers GS remaining on the side walls of the dummy gate pattern DG. The gate spacers GS may include at least one of a silicon nitride (SiN), a silicon oxynitride (SiON), a silicon oxide (SiO2), a silicon carbonitride (SiOCN), or a silicon oxycarbonitride (SiOCN), or a combination thereof. In an example embodiment, each of the gate spacers GS may be configured as a single film, but an example embodiment thereof is not limited thereto. The gate spacers GS may have a multiple film structure.

Figure 3E:
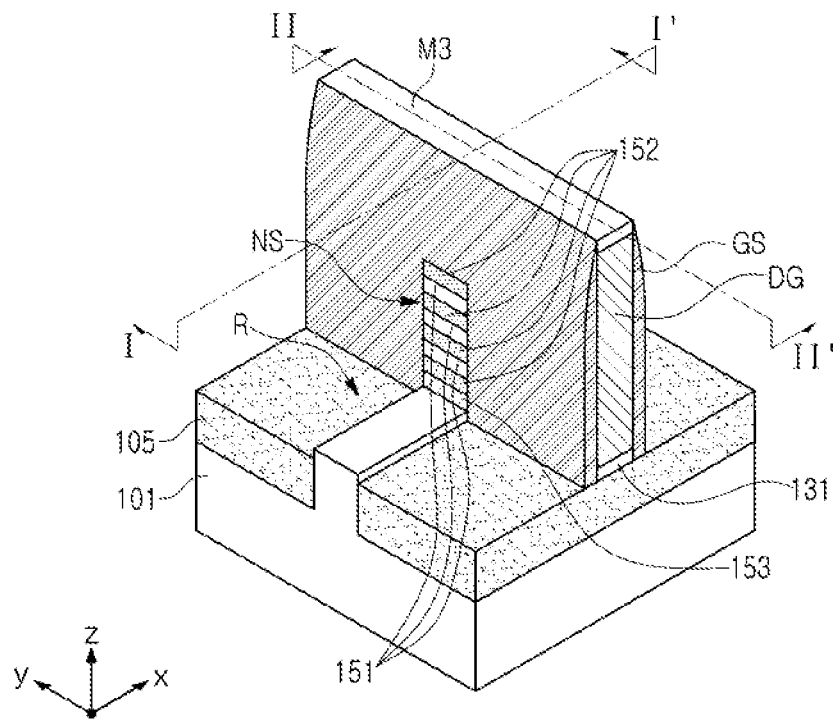
Figure 3F:
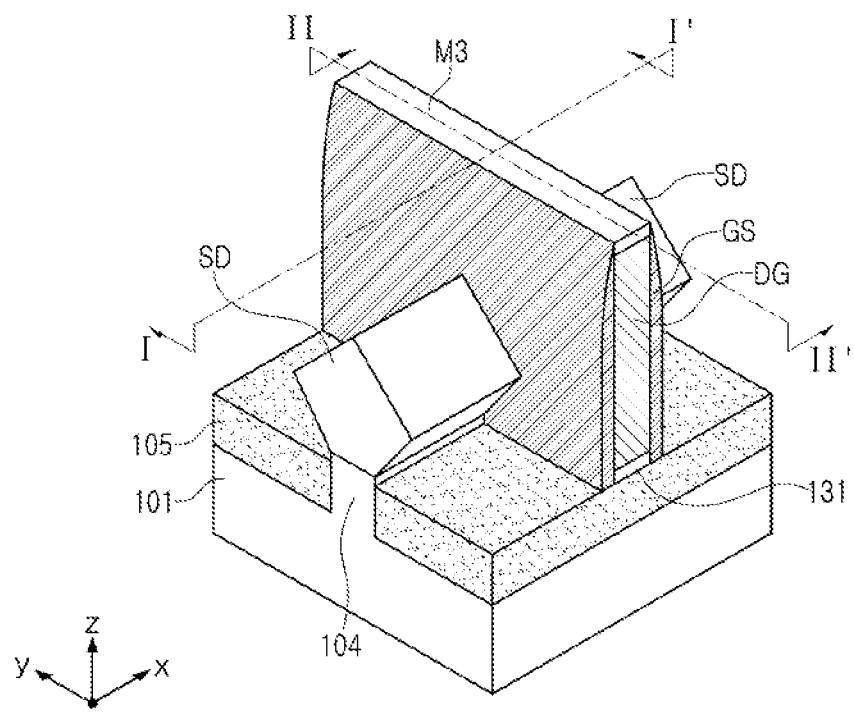

Referring to FIG. 3E, the fin-type structure AF exposed to both sides of the dummy gate pattern DG and the gate spacers GS may be removed, thereby forming a recess R in the fin-type structure AF.

Figure 4A:
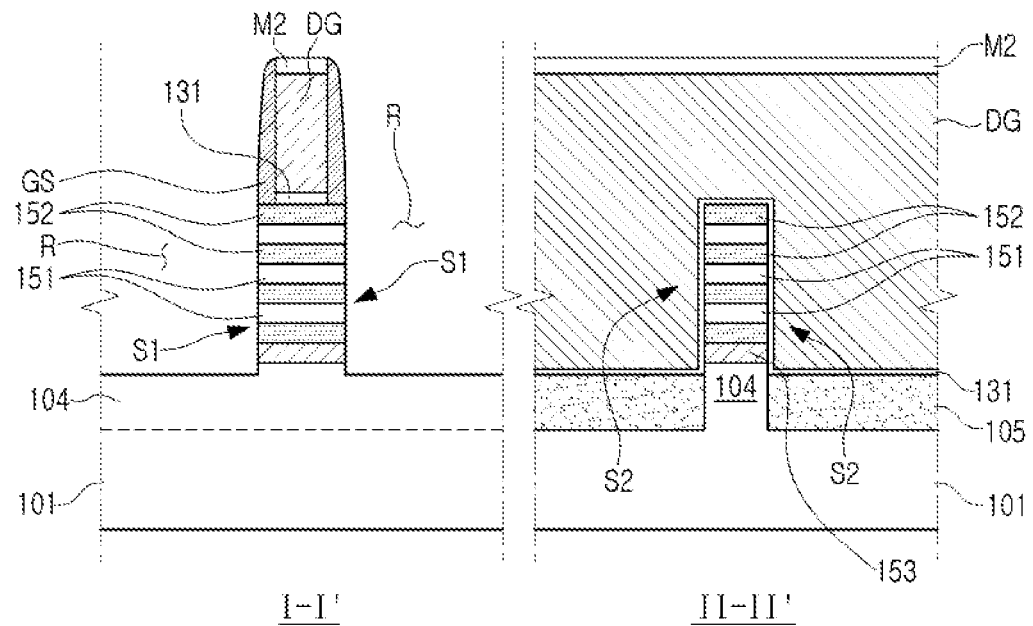
FIGS. 4A to 4C are cross-sectional diagrams illustrating portions of processes (formation of a source/drain) of a method for manufacturing a semiconductor device according to an example embodiment of the present inventive concept.
Figure 4B:
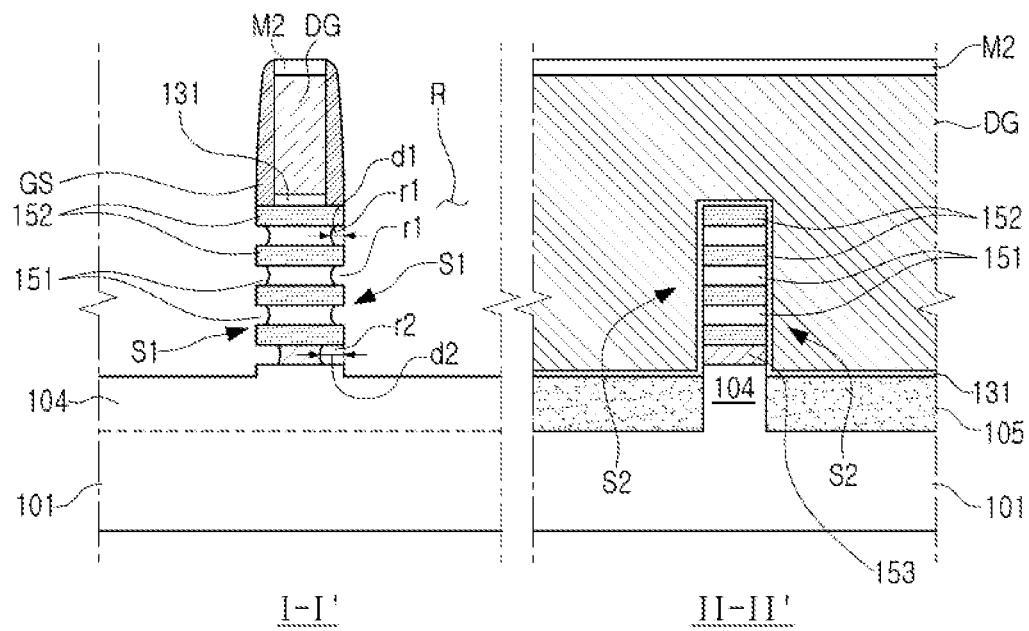
Figure 4C:
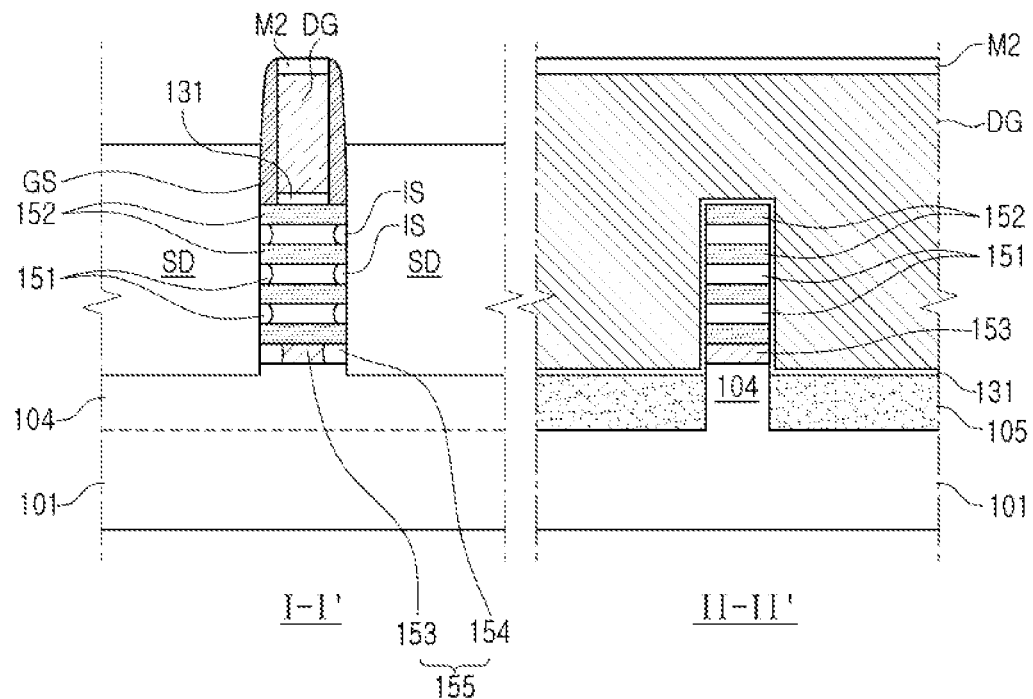

In a subsequent process for forming a source/drain region, side walls of the active region 104 providing a bottom surface of the recess R and of the fin-type structure AF providing side surfaces of the recess R may be used as epitaxial seeds. In this process, or in a subsequent process, a process for forming internal spacers and an insolation film may be performed. FIGS. 4A to 4C are cross-sectional diagrams illustrating portions of processes (formation of a source/drain) of a method for manufacturing a semiconductor device according to an example embodiment.

FIG. 4A is cross-sectional diagrams taken along lines I-I' and II-II' in FIG. 3E.

Referring to FIG. 4A, as described above, a recess R may be formed in portions of a fin-type structure AF disposed below both sides of the dummy gate pattern DG.

A process for removing the above-described portions of the fin-type structure AF may include a process of partially etching the fin-type structure AF using the mask pattern M2 and the gate spacers GS as etch masks.

The etching process may be performed until an upper surface of the active region 104 is exposed on both sides of the dummy gate pattern DG. Using this process, the fin-type structure AF may include first side surfaces S1 opposing each other in the first direction (e.g., X direction) and second side surfaces S2 opposing each other in the second direction (e.g., Y direction).

The second side surfaces S2 of the fin-type structure AF may be covered by the dummy gate pattern DG. For example, the dummy gate pattern DG may cover an upper surface and the second side surfaces S2 of the fin-type structure AF, and may cover the upper surfaces of the device isolation layer 105. The etch stop pattern 131 may be interposed between the dummy gate pattern DG and the fin-type structure AF, and the etch stop pattern 131 may extend to a space between the dummy gate pattern DG and the device isolation layer 105. The first side surfaces S1 of the fin-type structure AF may not be covered by the dummy gate pattern DG and may be exposed by the recess R.

The fin-type structure AF may include a semiconductor pattern for isolation 153' disposed on the active region 104 and first semiconductor patterns 151 and second semiconductor patterns 152 alternately layered on the semiconductor pattern for isolation 153'. The second semiconductor pattern 152 may be disposed directly on the semiconductor pattern for isolation 153'. For example, the second semiconductor patterns 152 may include Si, and the semiconductor pattern for isolation 153' and the first semiconductor patterns 151 may include SiGe. The semiconductor pattern for isolation 153' may include a higher content of Ge than a content of Ge included in the first semiconductor pattern 151. In some embodiments, a content of Ge included in the semiconductor pattern for isolation 153' may be higher than a content of Ge included in the first semiconductor patterns 151 (e.g., by to % or 20%).

Referring to FIG. 4B, the second semiconductor patterns 152 exposed to the recess R may be selectively etched.

In this process, the second semiconductor patterns 152 may not be etched. Exposed portions of the first semiconductor patterns 151 may be etched, thereby forming a first recess region r1 on both sides of each of the first semiconductor patterns 151 in the first direction (e.g., X-direction). In a selective etching process, the semiconductor pattern for isolation 153 may also be etched on both side surfaces exposed along with the first semiconductor patterns 151. Accordingly, for example, a second recess region r2 may be formed on both sides of each of the semiconductor pattern for isolation 153 in the first direction.

As described above, by using a difference in content of Ge, the semiconductor pattern for isolation 153 may have an etch rate higher than an etch rate of the first semiconductor patterns 151. As a result, as illustrated in FIG. 4B, the second recess region r2 may have a width greater than a width of the first recess region r1. A semiconductor region 153 partially remaining from the semiconductor pattern for isolation 153' may be disposed in a central region between the first semiconductor patterns 151 in the first direction. The semiconductor region 153 may form a portion of an isolation film. In an example embodiment, the semiconductor pattern for isolation 153' may be configured to partially remain, but an example embodiment thereof is not limited thereto. By increasing a difference in etch rate (e.g., a difference in content of Ge), the semiconductor pattern for isolation 153' may be removed. When the semiconductor pattern for isolation 153' is removed, the isolation film may be formed of an insulator (see FIG. 7).

Referring to FIG. 4C, internal spacers IS and an insulation region 154 may be formed in the first recess region r1 of the first semiconductor patterns 151 and the second recess region r2 of the semiconductor pattern for isolation 153'. Therefore a source/drain region SD may be formed in the recess R. FIG. 4C is cross-sectional diagrams taken along lines I-I' and II-IF in FIG. 3F.

By performing an oxidation process, the first side surfaces S1 of the fin-type structure AF may be oxidized. As a result, the internal spacers IS may be formed on both sides of the each of the first semiconductor patterns 151 in the first direction, and the insulation region 154 may be formed on both sides of the semiconductor pattern for isolation 153' in the first direction. The internal spacers IS may be disposed between a source/drain and a gate electrode formed in a subsequent process.

For example, the internal spacers IS may be formed of an insulating layer or a semiconductor layer in which a dopant is not doped. In some example embodiments, the internal spacers IS may include at least one of insulating materials among SiN, SiCN, SiOCN, SiBCN, or SiBN. For example, the internal spacers IS may include a silicon nitride. In an example embodiment, the internal spacers IS may include a semiconductor in which impurities are not doped, or a semiconductor having a dopant with a conductivity-type different from a conductivity-type of impurities of a source/drain.

As the insulation region 154 is formed along with the internal spacers IS in the same oxidation process, where the insulation region 154 may include the same material as a material of the internal spacers IS. A width of the insulation region 154 may be greater than a width of the internal spacer IS.

Accordingly, the semiconductor region 153 and an isolation film 155 (having the insulation regions 154 on both sides thereof) may be disposed between the fin-type structure AF and the active region 104. As the isolation film 155, provided in an example embodiment, may have electrical insulation properties, the isolation film 155 may effectively prevent leakage of current through a substrate (or the active region 104) between adjacent devices.

An epitaxial growth process may be performed on the fin-type structure AF to fill the recess R to form the source/drain region SD.

The source/drain region SD may be directly connected to the second semiconductor patterns 152 used as channel layers and may be insulated from the first semiconductor patterns 151 by the internal spacers IS. Epitaxial regions growing on both sides of the dummy gate pattern DG may be provided as the source/drain regions SD. The epitaxial growth process may be performed using sidewalls of the active region 104 providing a bottom surface of the recess R and of the fin-type structure AF providing side surfaces of the recess R as seeds. For example, the source/drain regions SD may include a silicon-germanium (SiGe) in which a p-type dopant is doped and may provide a p-MOSFET. The source/drain regions SD may have a variety of shapes defined as a crystallographically stable surface during the growth process. For example, each of a source/drain region SD1 and an epitaxial region EP may have a pentagonal cross-sectional surface.

In another example embodiment, the source/drain region SD may be formed through a different epitaxial growth process and may include silicon (Si) in which an n-type dopant is doped or silicon carbide (SiC). The source/drain region SD may have a hexagonal cross-sectional surface or a polygonal cross-sectional surface formed in gentle angle.

As described above, before forming an epitaxial layer for the source/drain region SD, the first and second recess regions r1 and r2 may be formed by further etching side surfaces of the first semiconductor patterns 151 and the semiconductor pattern for isolation 153'. The process for selectively forming the internal spacer IS and the insulation region 154 in the first and second recess regions r1 and r2 may then be performed. In this process, the isolation film 155 provides for electrical isolation between the fin-type structure AF and the active region 104 may be formed. The isolation film 155 in an example embodiment may include the insulator regions 154 disposed on both sides of the isolation film 155 in the first direction, respectively, and the semiconductor region 153 disposed between the insulation region 154.

Figure 5A:
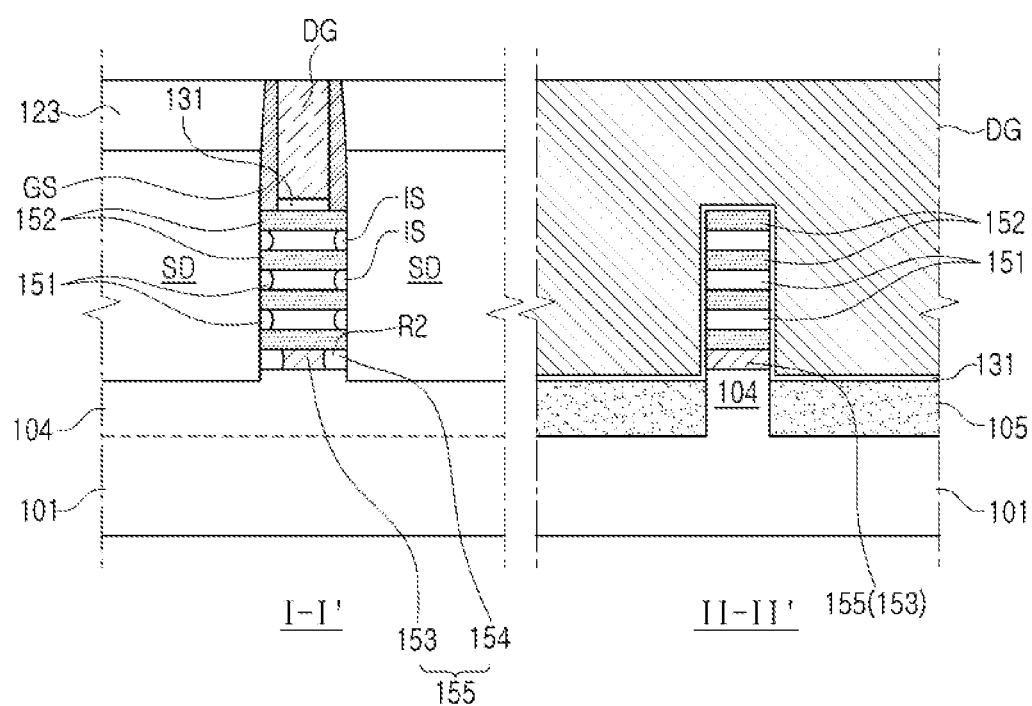
FIGS. 5A to 5C are cross-sectional diagrams illustrating portions of processes (formation of a gate electrode) of a method for manufacturing a semiconductor device according to an example embodiment of the present inventive concept.
Figure 5B:
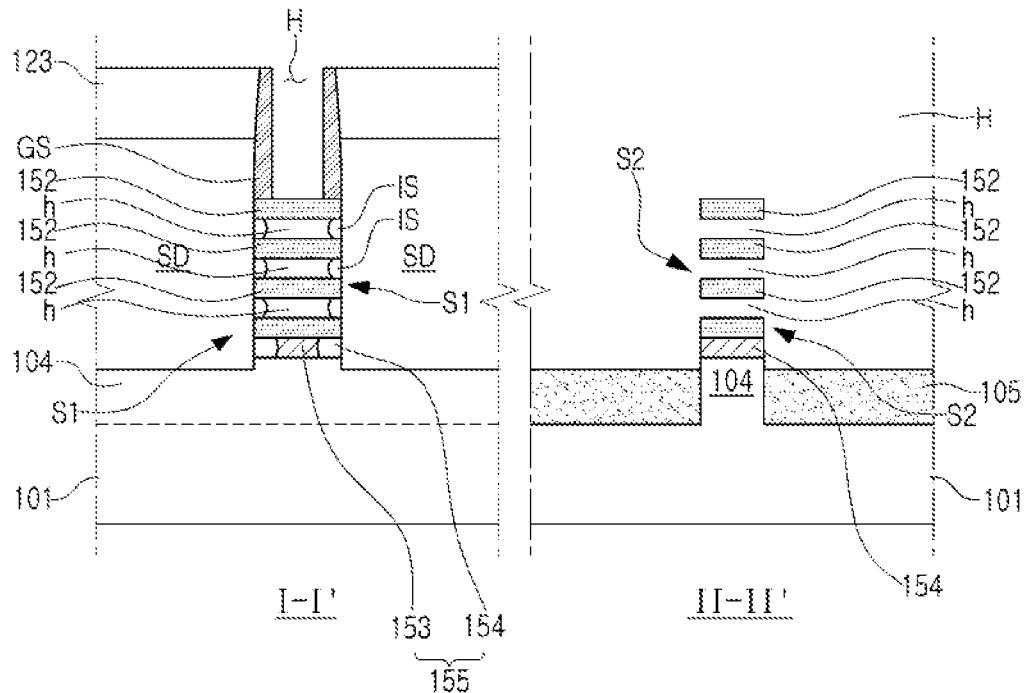
Figure 5C:
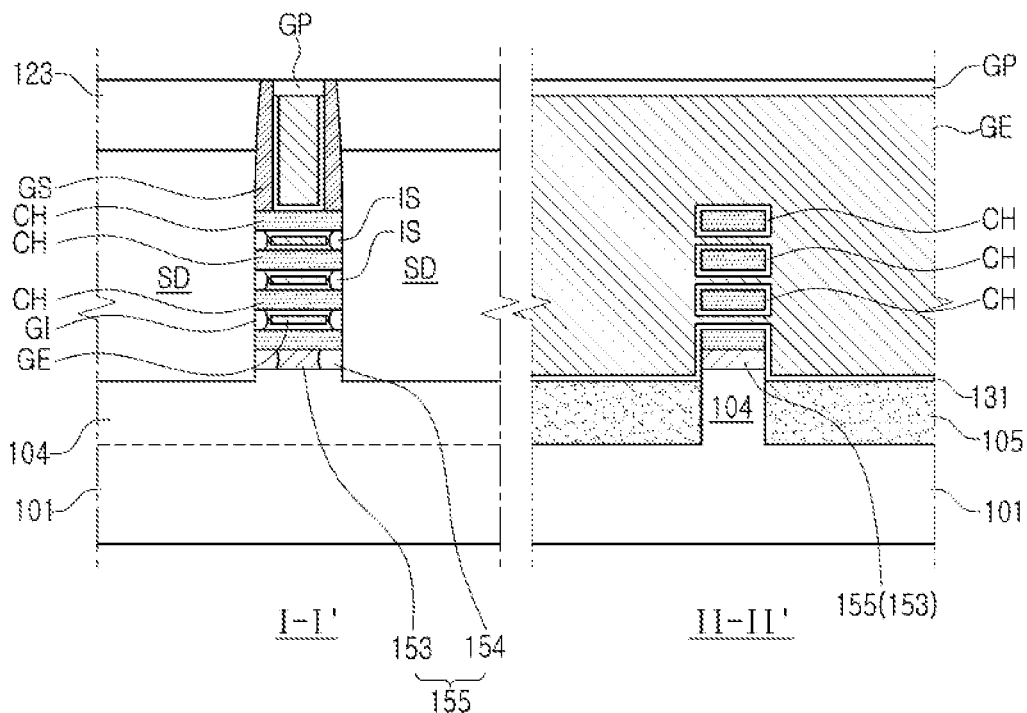

Processes for replacing the dummy gate pattern with a gate electrode may be performed, thereby manufacturing a semiconductor device. FIGS. 5A to 5C are cross-sectional diagrams illustrating portions of processes of a method for manufacturing a semiconductor device according to an example embodiment, illustrating processes for forming a gate electrode.

Referring to FIG. 5A, an interlayer insulating film 123 may be formed, and a planarization process may be performed to expose a dummy gate pattern DG.

The interlayer insulating film 123 may be formed to cover the source/drain regions SD, the dummy gate pattern DG, and gate spacers GS on a substrate 101. Additionally, the interlayer insulating film 123 may be planarized until the dummy gate pattern DG is exposed.

In this planarization process, a second mask pattern M2 may be removed. The interlayer insulating film 123 may include at least one of a low-k material, an oxide film, a nitride film, or an oxynitride film. The low-k material may include flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), and flowable CVD (FCVD) oxide, or combinations thereof.

Referring to FIG. 5B, the dummy gate pattern DG may be removed through an exposed region of the dummy gate pattern DG, and a first semiconductor pattern may be selectively removed.

In this process, the dummy gate pattern DG may be removed, and an open region H may be formed between the gate spacers GS. An exposed etch stop pattern 131 may be selectively removed through the open region H. After the etch stop pattern is removed, the second side surfaces S2 of the first semiconductor patterns 151 and the second semiconductor patterns 152 of the fin-type structure AF may be exposed through the open region H. Using this process, the first semiconductor patterns 151 may be selectively removed, and additional open regions h connected to the open region H may be formed. The additional open region h may be disposed between the second semiconductor patterns 152, channel layers CH. Accordingly, the open region H and the additional open regions h connected to the open region H may be provided as spaces for a gate structure.

Referring to FIG. 5C, a gate insulating layer GI and a gate electrode GE may be formed in the open regions H and h formed in the above-described process.

In this process, the gate insulating layer GI may be conformally formed on exposed surfaces of the open region H and the additional open regions h. The gate insulating layer GI may be formed to surround each of the second semiconductor patterns 152. The gate insulating layer GI may also be conformally formed on sidewalls of the gate spacers GS exposed to the open region H, and surfaces of the source/drain region SD exposed to the additional open regions h.

The gate electrode GE may be formed on the gate insulating layer GI and may extend in the second direction (y). For example, the gate electrode GE may be formed in a space between the gate insulating layers GI and in a space between the second semiconductor patterns 152.

The gate insulating layer GI may include a high-k material having a dielectric constant higher than a dielectric constant of a silicon oxide film. For example, the gate insulating layer GI may include one of a hafnium oxide, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide, and a lead zinc niobate, but an example of the material is not limited thereto.

The gate electrode GE may include a conductive material. For example, the gate electrode GE may include at least one of TiN, WN, TaN, Ru, TiC, TaC, Ti, Ag, Al, TiAl, TiAlN, TiAlC, TaCN, TaSiN, Mn, Zr, W, or Al. In the diagram, the gate electrode GE is configured as a single layer, but an example embodiment thereof is not limited thereto. For example, the gate electrode GE may include a work function conductive layer performing a work-function adjustment, and a filling conductive layer filling a space formed by the work function conductive layer performing work-function adjustment.

In an example embodiment, the semiconductor pattern for isolation 153' may be partially removed, but an example embodiment thereof is not limited thereto. The semiconductor pattern for isolation 153' may also be completely removed, and a semiconductor material may be selected as a replacement material instead of an insulating material.

Figure 6:
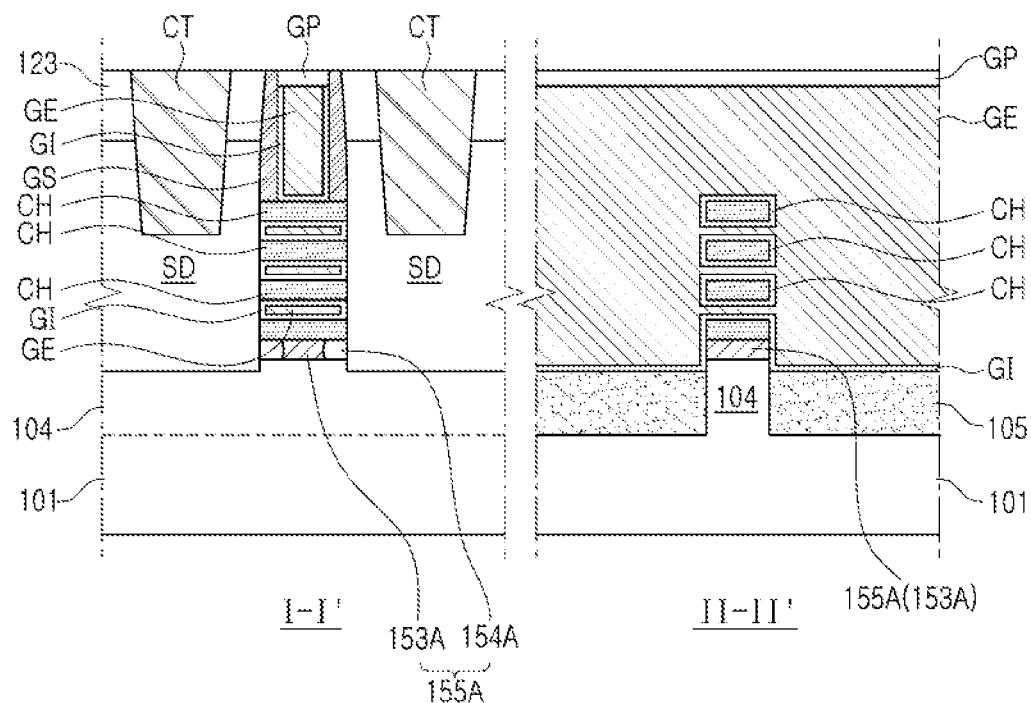
FIGS. 6 to 8 are cross-sectional diagrams illustrating a semiconductor device according to example embodiments of the present inventive concept.
Figure 7:
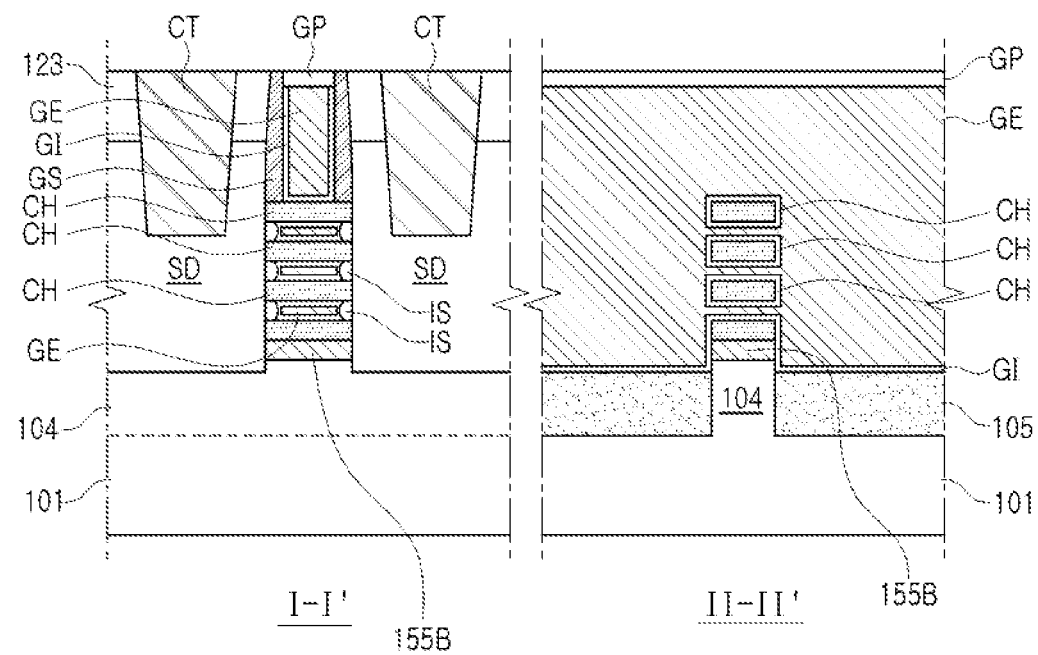
Figure 8:
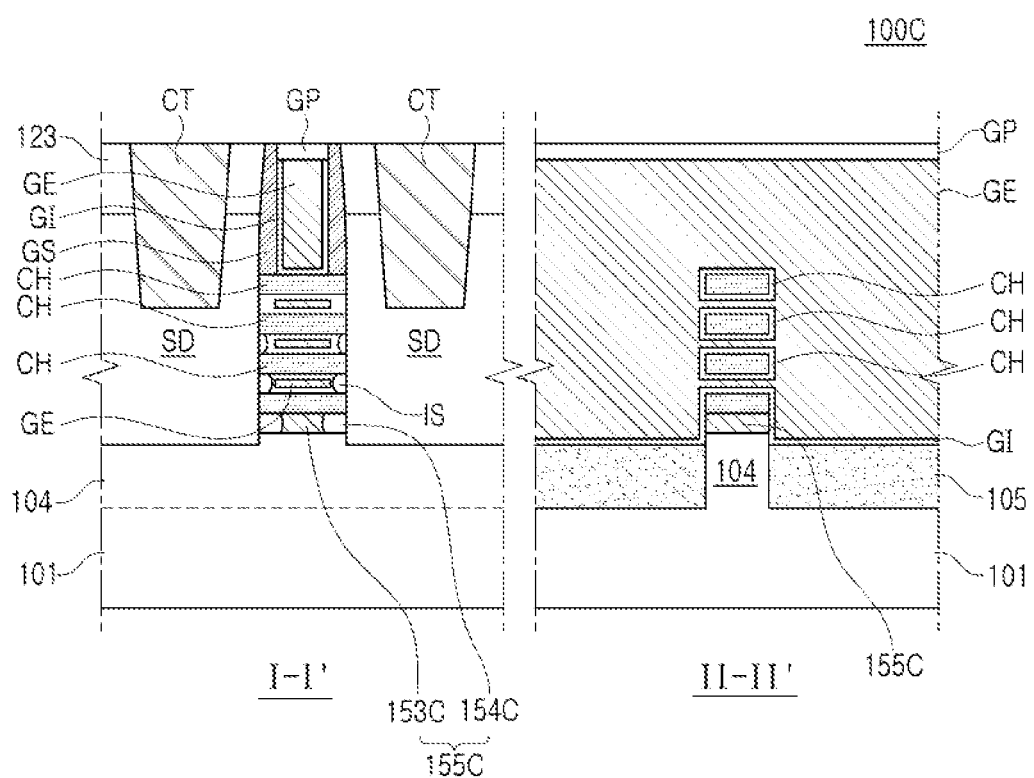

Accordingly, a structure of the isolation film may be varied, and an example embodiment thereof is illustrated in FIGS. 6 to 8.

FIGS. 6 to 8 are cross-sectional diagrams illustrating a semiconductor device according to example embodiments.

Referring to FIG. 6, a semiconductor device 100A may be similar to the semiconductor device 100 illustrated in FIGS. 1 and 2, but differently from the semiconductor device 100, the internal spacers may not be formed on both sides of the channel layers CH in the semiconductor device 100A. The elements of the semiconductor device 100A described in the description below may be the same as or like the elements of the semiconductor device 100 illustrated in FIGS. 1 and 2 unless otherwise indicated.

Similar to the aforementioned example embodiment, a fin-type structure AF may include gate electrodes GE surrounding the channel layers CH, both sides of which may be connected to a source/drain region SD. In an example embodiment, internal spacers (the internal spacers IS in FIG. 2) may not be formed between the gate electrode GE and both sides disposed between the channel layers CH or between the gate electrode GE and the source/drain region SD. The gate electrode GE may be isolated from the source/drain region SD by a gate insulating layer GI.

An isolation film 155A employed in an example embodiment may include edge regions 154A disposed on both sides of the isolation film 155A in the first direction (e.g., X direction), respectively, and a central region 153A disposed between the edge regions 154A. In some example embodiments, the edge regions 154A may include an insulating material similar to the insulating material described in the aforementioned example embodiment. But, in the aforementioned example embodiment, as the internal spacers are not formed, the edge regions 154A may be formed of a different material without consideration of a process for forming the internal spacers. For example, the edge regions 154A may include a semiconductor material doped to a dopant having a conductivity-type different from a conductivity-type of a dopant of the source/drain region SD, or an undoped semiconductor material. The central region 153A may include SiGe including a relatively high content of Ge similarly to the semiconductor region 153 described in the aforementioned example embodiment.

Referring to FIG. 7, a semiconductor device 100B may be similar to the semiconductor device 100 illustrated in FIGS. 1 and 2, but differently from the semiconductor device 100, the isolation film 155 may be configured to have a single structure in the semiconductor device 100B. The elements of the semiconductor device 100B described in the description below may be the same as or similar to the elements of the semiconductor device 100 illustrated in FIGS. 1 and 2 unless otherwise indicated.

Similarly to the aforementioned example embodiment, a fin-type structure AF may include a gate electrode GE surrounding channel layers CH. Both sides of the fin-type structure AF may be connected to a source/drain region SD. Internal spacers IS may be disposed on both sides of the gate electrode GE.

In an example embodiment of an isolation film 155B, edge regions and also a surrounding region of the isolation film 155B may include the same material as a material of the internal spacers IS. In some example embodiments, when the internal spacers IS include an insulator, the isolation film 155B may be formed of the same material. As described in the aforementioned manufacturing processes (see FIGS. 4A to 4C), an insulator region of the isolation film may expand in accordance with a selection of a material (a difference in content ratio of SiGe to Ge) of a first semiconductor pattern 151 and a second semiconductor pattern 152 and a selective etching process performed on the first semiconductor pattern 151, and as in an example embodiment, a surrounding region of the isolation film may be replaced with an insulator (for example, a ratio of an insulating region in an overall isolation film region may be changed to a ratio between 10% and 100%).

In other example embodiments, when the internal spacers IS include a semiconductor having a second-conductivity-type dopant or an updoped semiconductor, the isolation film 155B may also be formed of the same semiconductor.

In an example embodiment, in the process for forming the internal spacers IS (see FIG. 4b), a semiconductor pattern for isolation may have enough selectivity with the first semiconductor pattern to remove a part of the semiconductor pattern for isolation. For example, when the semiconductor pattern for isolation is formed of SiGe, a content of Ge (e.g., 75% or higher) may be configured to be higher than a content of Ge (e.g., 40% or lower) included in the first semiconductor pattern.

Referring to FIG. 8, a semiconductor device 100C may be similar to the semiconductor device 100 illustrated in FIGS. 1 and 2, but differently from the semiconductor device 100, the internal spacers IS may be formed on portions of channel layers CH and the internal spacers may have different widths in the semiconductor device 100C. The elements of the semiconductor device 100C described in the description below may be the same as or similar to the elements of the semiconductor device 100 illustrated in FIGS. 1 and 2 unless otherwise indicated.

Similarly to the aforementioned example embodiment, a fin-type structure AF may include a gate electrode GE surrounding channel layers CH, both sides of which may be connected to a source/drain region SD. In an example embodiment, the internal spacers IS may be formed between portions of the gate electrodes GE and a source/drain region SD. As illustrated in FIG. 8, the internal spacers IS may not be formed on both sides of an uppermost gate electrode GE, and the internal spacers IS may be formed on both sides of the other two gate electrodes GE. Also, the internal spacers IS disposed in the two gate electrodes GE may also have different widths.

An isolation film 155C employed in an example embodiment may include edge regions 154C disposed on both sides of the isolation film 155C in the first direction, respectively, and formed of the same material as a material of the internal spacers IS, and a central region 153C disposed between the edge regions 154C. In some example embodiments, the edge regions 154C may include the same insulating material or the same semiconductor material as that of the internal spacers IS. The central region 153C may include SiGe including a relatively high content of GE similarly to the semiconductor region 153 described in the aforementioned example embodiment.

According to the aforementioned example embodiments, a semiconductor device which may have improved electrical properties by preventing leakage of current through a substrate between adjacent devices (e.g., a transistor), and a method of manufacturing the semiconductor device may be provided.

While an example embodiments have been shown and described above, it will be apparent to those skilled in the art that modifications and variations could be made without departing from the scope of the present inventive concept as defined by the appended claims.

What is claimed is:

1. A semiconductor device, comprising:
a substrate;
an active region protruding on the substrate and extending in a first direction;
a plurality of channel layers disposed on the active region and spaced apart from each other in a second direction perpendicular to an upper surface of the substrate;
an isolation film disposed between a lowermost channel layer of the plurality of channel layers and the active region and including a semiconductor region;
a gate electrode surrounding each of the plurality of channel layers and extending in a second direction intersecting the first direction; and
a source/drain region disposed on at least one side of the gate electrode and connected to each of the plurality of channel layers,
wherein the isolation film is disposed on a level higher than a bottom surface of the source/drain region in the second direction, and
wherein the semiconductor region of the isolation film includes SiGe including a content of 35% or higher of Ge (Germanium).

2. The semiconductor device of claim 1, wherein the isolation film further includes insulator regions disposed on both sides of the isolation film in the first direction, and the semiconductor region is disposed between the insulator regions.

3. The semiconductor device of claim 2, further comprising internal spacers disposed on both sides of the gate electrode in the first direction between the plurality of channel layers,
wherein a width of each of the insulator regions in the first direction is greater than a width of each of the internal spacers in the first direction.

4. The semiconductor device of claim 3, wherein the insulator regions and the internal spacers include a same material.

5. The semiconductor device of claim 3, wherein two or more of the internal spacers have different widths in the first direction.

6. The semiconductor device of claim 1, wherein each of the plurality of channel layers includes a semiconductor material different from that of the semiconductor region of the isolation film.

7. A semiconductor device, comprising:
a substrate;
an active region protruding from the substrate and extending in a first direction;
a plurality of channel layers disposed on the active region and spaced apart from each other in a direction perpendicular to an upper surface of the substrate;
an isolation film disposed between a lowermost channel layer of the plurality of channel layers and the active region;
a gate electrode surrounding the plurality of channel layers and extending in a second direction intersecting the first direction;
internal spacers disposed between the plurality of channel layers and disposed on both sides of the gate electrode in the first direction; and
a plurality of source/drain regions disposed on both sides of the gate electrode in the first direction and connected to the plurality of channel layers,
wherein the internal spacers and regions adjacent to both sides of the isolation film in the first direction include a same material, and the isolation film is disposed on a level higher than a bottom surface of the source/drain region, wherein the isolation film further includes an internal region disposed between the regions adjacent to both sides of the isolation film in the first direction and including a semiconductor material.

8. The semiconductor device of claim 7, wherein each of the plurality of channel layers includes a semiconductor material different from the semiconductor material of the internal region.

9. The semiconductor device of claim 7, wherein the internal spacers and regions adjacent to both sides of the isolation film in the first direction include a same insulating material.

10. The semiconductor device of claim 7,
wherein the source/drain region includes a semiconductor having a first conductivity-type dopant, and
wherein the internal spacers include a semiconductor having a second conductivity-type dopant or an undoped semiconductor.

11. The semiconductor device of claim 7, wherein the internal region of the isolation film includes SiGe (Silicon-Germanium).

12. The semiconductor device of claim 7, wherein the internal spacers include a semiconductor material different from the semiconductor material of the internal region.

13. The semiconductor device of claim 7, wherein a width of each of the adjacent regions of the isolation film in the first direction is greater than a width of each of the internal spacers in the first direction.

14. A semiconductor device, comprising:
a substrate;
an active region protruding from the substrate and extending in a first direction;
a plurality of channel layers disposed on the active region and spaced apart from each other in a direction perpendicular to an upper surface of the substrate;
a gate electrode surrounding the plurality of channel layers and extending in a second direction intersecting the first direction;
internal spacers disposed between the plurality of channel layers and disposed on both sides of the gate electrode in the first direction;
an isolation film disposed between a lowermost channel layer of the plurality of channel layers and the active region, wherein the isolation film and the internal spacers have a same insulating material; and
a source/drain region disposed on each of both sides of the gate electrode in the first direction, having a bottom surface disposed on a level lower than the isolation film, and connected to each of the plurality of channel layers.

* * * * *